US010229726B2

(12) United States Patent
Schwartz et al.

(10) Patent No.: US 10,229,726 B2
(45) Date of Patent: Mar. 12, 2019

(54) MEMORY CIRCUIT FOR READING FERROELETRIC MEMORY HAVING GAIN ELEMENT INCLUDING FEEDBACK CAPACITOR

(71) Applicant: Palo Alto Research Center Incorporated, Palo Alto, CA (US)

(72) Inventors: David Eric Schwartz, San Carlos, CA (US); Tse Nga Ng, Sunnyvale, CA (US); Ping Mei, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/747,679

(22) Filed: Jun. 23, 2015

(65) Prior Publication Data
US 2016/0379703 A1    Dec. 29, 2016

(51) Int. Cl.
*G11C 11/22* (2006.01)
(52) U.S. Cl.
CPC ........ *G11C 11/2273* (2013.01); *G11C 11/221* (2013.01)
(58) Field of Classification Search
CPC ............ G11C 11/2273; G11C 11/221
USPC .......................................... 365/145, 149, 207
See application file for complete search history.

(56) References Cited

U.S. PATENT DOCUMENTS

| 3,579,208 | A | * | 5/1971 | Bartlett | G11C 11/22 365/145 |
| 5,274,583 | A | * | 12/1993 | Rapp | G11C 11/22 365/145 |
| 5,523,964 | A | * | 6/1996 | McMillan | G11C 11/22 257/295 |
| 5,835,400 | A | * | 11/1998 | Jeon | G11C 11/22 365/145 |
| 6,611,448 | B2 | * | 8/2003 | Nair | G11C 11/22 365/145 |
| 6,912,167 | B2 | * | 6/2005 | Tam | G11C 11/22 365/207 |
| 7,345,906 | B2 | * | 3/2008 | Karlsson | G11C 7/062 365/145 |
| 7,733,681 | B2 | * | 6/2010 | Miyamoto | G11C 11/22 365/117 |
| 2014/0169060 | A1 | * | 6/2014 | Schwartz | H03K 3/355 365/145 |

* cited by examiner

Primary Examiner — Tha-O H Bui
(74) Attorney, Agent, or Firm — Miller Nash Graham and Dunn

(57) ABSTRACT

A memory circuit has a ferroelectric memory cell having a word line and a bit line, an input transistor connected to the bit line, a gain element electrically connected the bit line, wherein the gain element includes a feedback capacitor, and an output terminal. A method of reading a memory cell includes applying a voltage to a word line of the memory cell, causing charge to transfer from the memory cell to a feedback capacitor, generating a voltage, amplifying the voltage by applying a gain having a magnitude of less than three, sensing an output voltage at an output node to determine a state of the memory cell, and storing the memory state in a latch.

18 Claims, 12 Drawing Sheets

MEMORY CIRCUIT FOR READING FERROELETRIC MEMORY HAVING GAIN ELEMENT INCLUDING FEEDBACK CAPACITOR

TECHNICAL FIELD

This disclosure relates to ferroelectric memory cells, more particularly to circuits for reading ferroelectric memory cells.

BACKGROUND

Ferroelectric (FE) memory devices typically consist of a ferroelectric capacitor. The capacitor has ferroelectric material between two conductive electrodes. For simplicity, the capacitor often has a parallel plate configuration, but may take many different forms. FE materials have remanent polarization after application and removal of an electric field that allows them to function as non-volatile memory cells.

Prior art FIG. 1 shows the hysteresis curve 10 of electric field E versus the polarization P when a positive or negative electric field is applied across the ferroelectric capacitor where $E_c$ is the coercive electric field and $P_r$ is the remnant polarization. The capacitor is bistable, with two different polarization states possible when no electric field is applied. These can be used to represent values '0' and '1.' In the figure, the point 12 represents a '1' and point 14 represents a '0.' This assignment is arbitrary and the opposite assignment could also be made. Memory elements require circuits to read and write them. Writing is easily accomplished by applying a voltage across the capacitor, with a positive potential used to write one value and a negative potential to write the other.

Reading these types of memory cells presents many challenges. A common method applies a potential across the capacitor and uses a charge amplifier to measure the charge released by the capacitor during the transition. FIG. 2 shows a hysteresis curve 20 demonstrating how distinct memory states correspond to different amounts of charge. A voltage is applied across the capacitor and the charge released by the capacitor during transition. A large value may represent a '0' and a small value may represent a '1.' This process typically requires a precision sense amplifier.

FIG. 3 shows an example of a prior art read-out circuit 30 in which charge from the FE memory cell is integrated on the feedback capacitor of an operational amplifier. The example circuit 30 has a memory cell 32 connected to a word line WL, an operational amplifier 34, an inverting buffer 36 and an output terminal 38. The circuit also includes a reset switch 40 and a feedback capacitor 42. In this example, the charge from the ferroelectric memory cell 32 is integrated on the feedback capacitor 42 of the operational amplifier 34. The output of the amplifier is buffered, in this case inverting buffer 36, prior to being output at the terminal 38.

The use of an operational amplifier may be undesirable or impractical as it can add significant cost to the memory and is challenging to fabricate in many low-cost and large-area electronic technologies, such as those employing solution-processed thin film transistors (TFTs). These technologies have high variability, low yield, and low channel mobilities relative to conventional, vacuum-processed silicon electronics technologies. These characteristics of solution-processed TFTs result in amplifiers having high offset and gain mismatches and low gain, making them unsuitable for sensitive charge amplification or transduction.

SUMMARY

An embodiment comprises a memory circuit having a ferroelectric memory cell having a word line and a bit line, an input transistor connected to the bit line, a gain element electrically connected the bit line, wherein the gain element includes a feedback capacitor, and an output terminal.

Another embodiment comprises a method of reading a memory cell that includes applying a voltage to a word line of the memory cell, causing charge to transfer from the memory cell to a feedback capacitor, generating a voltage, amplifying the voltage by applying a gain having a magnitude of less than three, sensing an output voltage at an output node to determine a state of the memory cell, and storing the memory state in a latch.

DETAILED DESCRIPTION OF THE EMBODIMENTS

Figure 1:
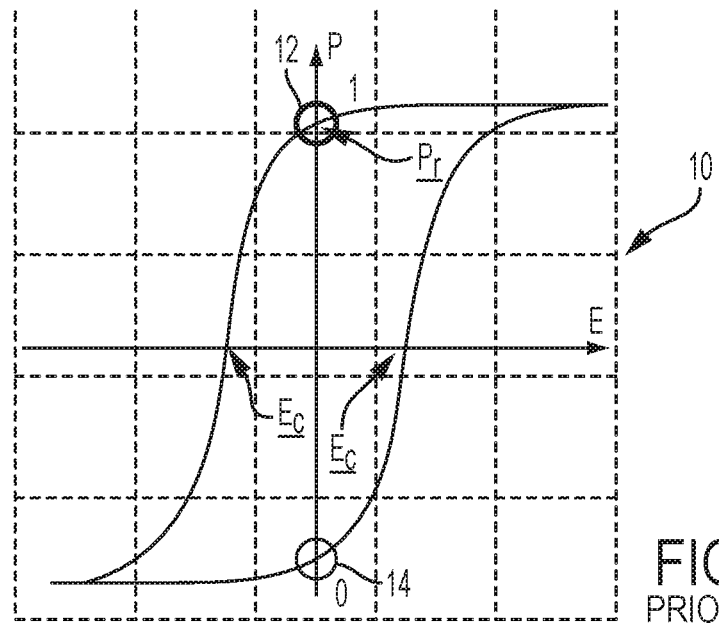
FIGS. 1 and 2 show embodiments of hysteresis curves for a ferroelectric memory cell.
Figure 2:
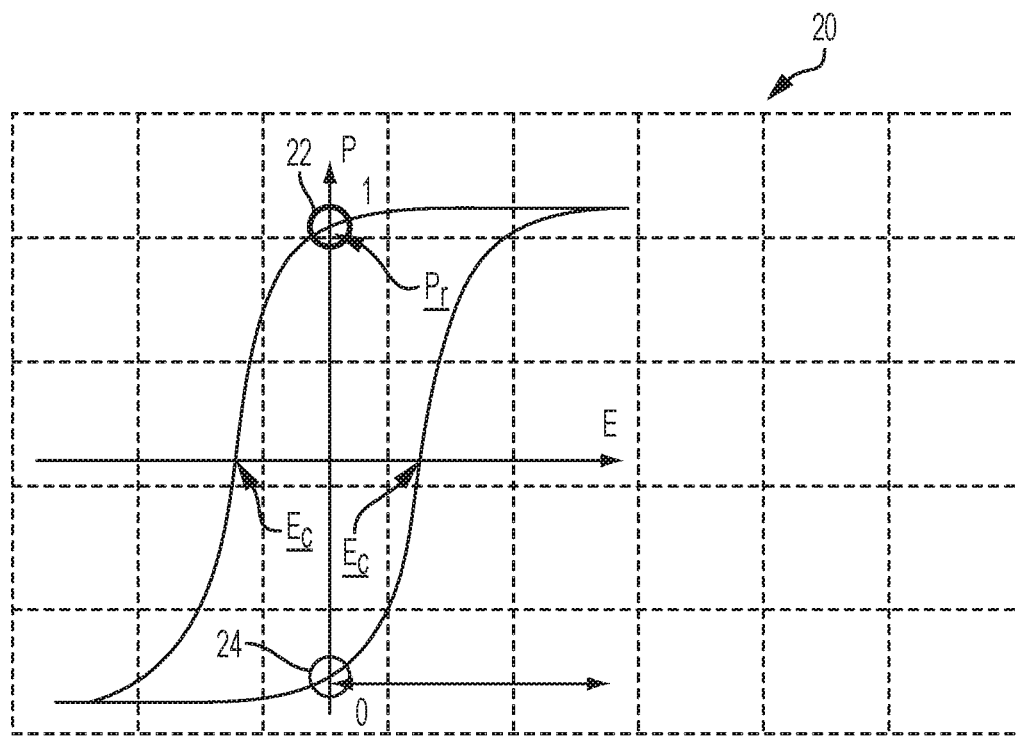
Figure 3:
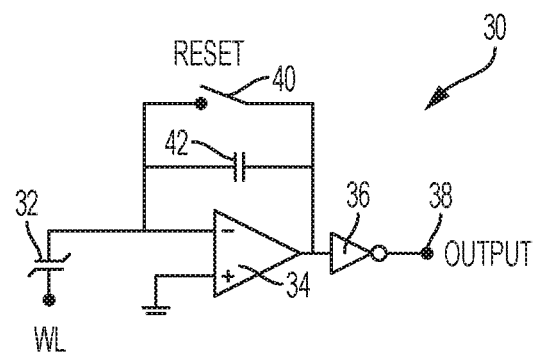
FIG. 3 shows a prior art embodiment of a ferroelectric memory cell read/write circuit.
Figure 4:
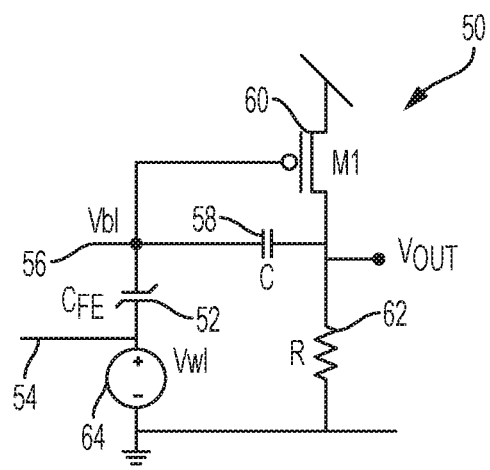
FIG. 4 shows an embodiment of a memory circuit with a ferroelectric memory cell.

FIG. 4 shows a memory readout circuit 50 including a ferroelectric memory cell. The circuit core, outside of the memory cell 52 and the voltage source 64, in this embodiment consists of a transistor M1 60, a resistor R 62, and a feedback capacitor C 58. For ease of understanding, the two sides of the memory cell are called the word line at voltage node Vwl and the bit line at node Vbl. The transistor M1 and resistor R form a gain element with the feedback capacitor C.

Contrary to the prior art embodiments, the gain element has a gain of 2 or 3, rather than the relatively high gain of an operational amplifier. Typically, such a low gain will not allow the charge to be read out accurately. However, the embodiments here allow for the application of low gain. One should note that gain typically has a negative sign, so the gain referred to here as being 2 or 3 is the magnitude of the gain, or the absolute value.

In operation, when a transient voltage pulse is applied to the wordline, charge from the ferroelectric memory cell transfers to the feedback capacitor C. If the gain provided by M1 and R is greater than unity, the change in voltage at Vout will be greater than the change at Vbl. A read operation biases the ferroelectric capacitor. In some ferroelectric memory readout circuits, the read operation also serves to write the memory cell to a 'reset' state. The reset state may defined as a 1 or a 0 depending upon what is selected.

Because of the limited gain in this circuit, the node Vbl is not a true virtual ground. Consequently, there is a tradeoff in the sizing of the feedback capacitor C. A small capacitor will lead to reduced voltage across the memory cell element and the possibility that the state of the memory cell will not be fully switched in the read operation. A large capacitor, alternatively, will reduce the gain from Vbl to Vout. One means of addressing this is to use a small capacitor and fully write the memory cell in a subsequent step.

Figure 5:
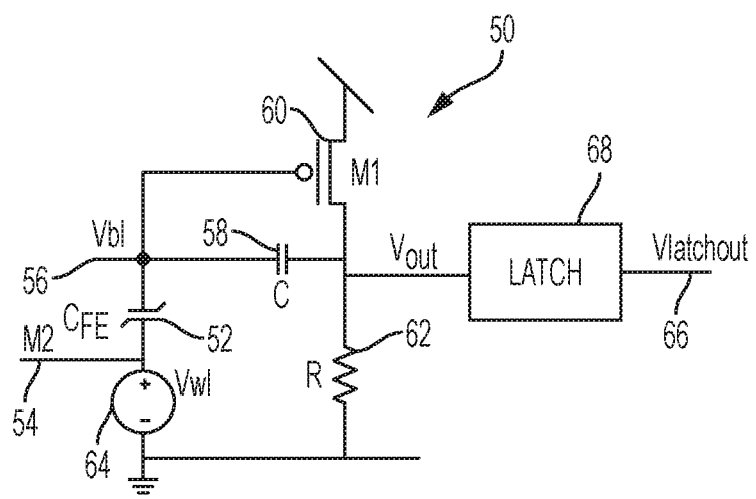
FIG. 5 shows an embodiment of a memory circuit with an output latch.

For some ferroelectric memory technologies, it is important that the duration of the bias pulse across the memory be limited as extended application of a bias can damage the memory. Furthermore, in some cases charge leakage from node Vbl will limit the amount of time that the output value is retained on Vout. FIG. 5 shows an embodiment of a readout circuit that includes an output latch 68 stage. The stage will store the output voltage at Vout, of the memory operation as output it as Vlatch 66 after the voltage pulse on Vwl is relaxed. This allows the pulse to be applied for a shorter period of time, limiting the possible damage. It also allows retention of the read memory value in the case of high leakage.

Figure 6:
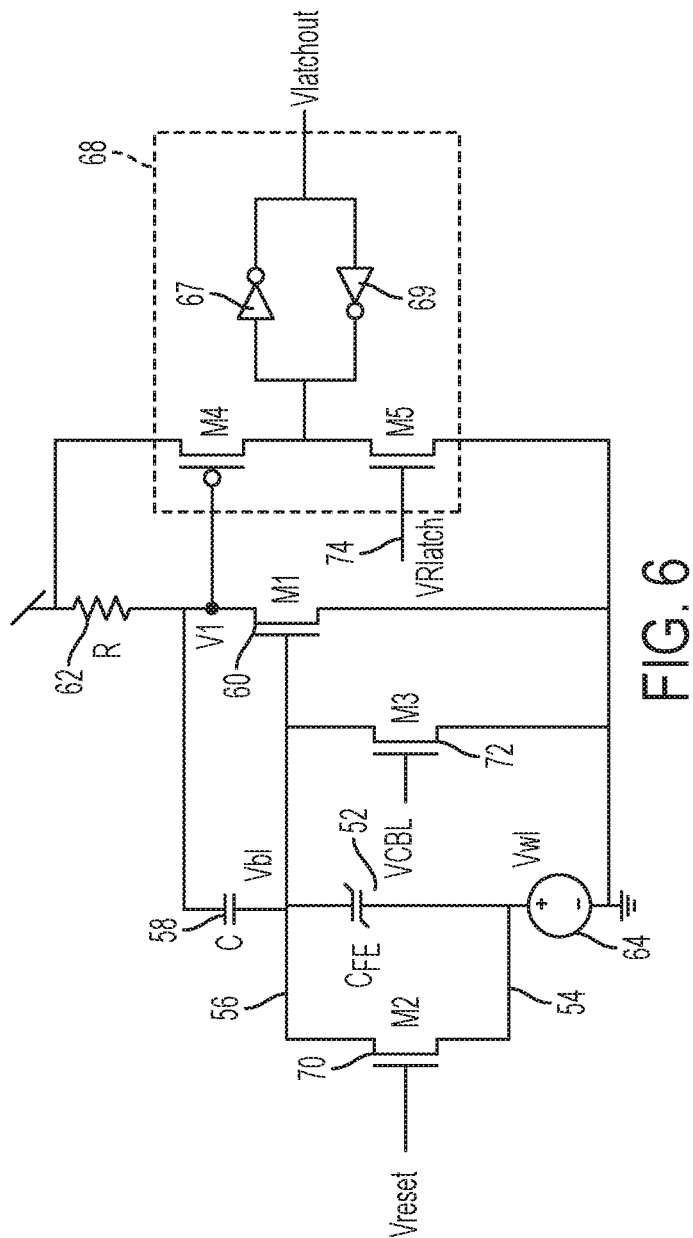
FIG. 6 shows an embodiment of a memory circuit with an output latch and reset transistors.

The core circuit can be enhanced in many ways. FIG. 6 shows an embodiment of the memory readout circuit having a latch circuit 68 implemented as complementary latch circuit. The latch circuit, in this embodiment, consists of transistors multiple transistors. In this circuit, inverters 67 and 69 form a cross-coupled pair, each of two transistors. In operation, the latch is reset with a positive pulse to VRLatch 74 at the gate of transistor M5. Upon reading the memory with an application of the voltage pulse to Vwl, depending on the state of the memory, the output at node Vout either switches the state of the latch or not. One should note that many other types of latches can be used instead.

Reset transistor 70 M2 'zeros' the floating node Vbl before a readout operation so that Vbl is not affected by residual charge. In operation, M2 is turned on by a positive signal to Vreset prior to a read operation. In practice, M2 can be on at all times except when reading or writing the memory cell.

Transistor M3 is used to write the memory cell. To write the cell, the VCBL is set to a high value while a pulse is applied to Vwl. Vbl is pinned to ground. The memory cell can be written to a '1' or a '0' value by application respectively of a positive or negative voltage pulse to Vwl. If the value of C is chosen such that a sufficient bias is achieved across the memory cell during a read operation to fully write it, then it may not be necessary to use M3 for writing a '1' to the memory cell. Alternatively, the memory can be written by an external voltage source (not shown) connected between Vbl and Vwl or between Vbl and ground.

Figure 7:
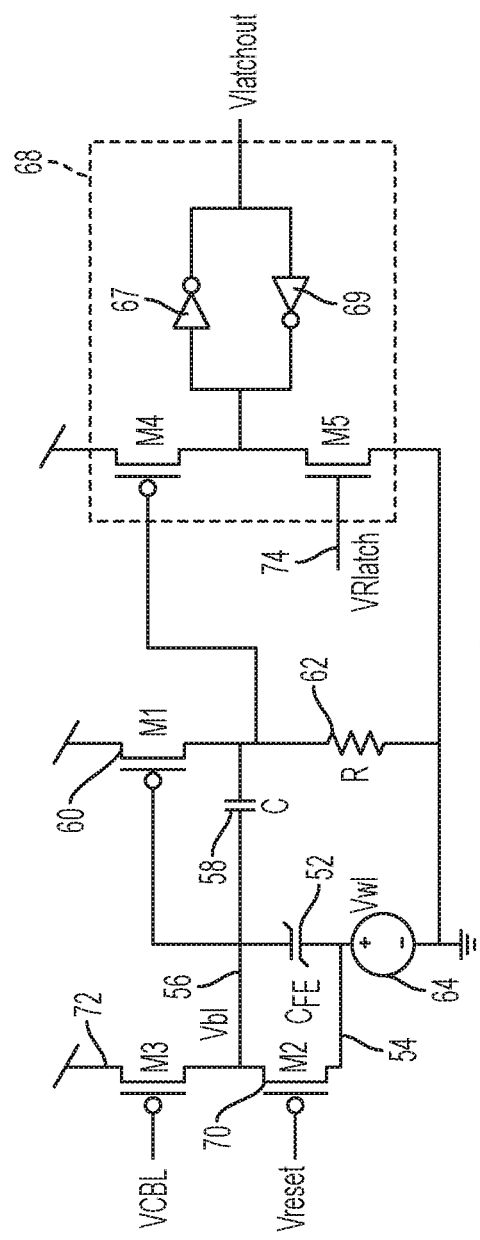
FIG. 7 shows an embodiment of a memory circuit with an input TFT.
Figure 8:
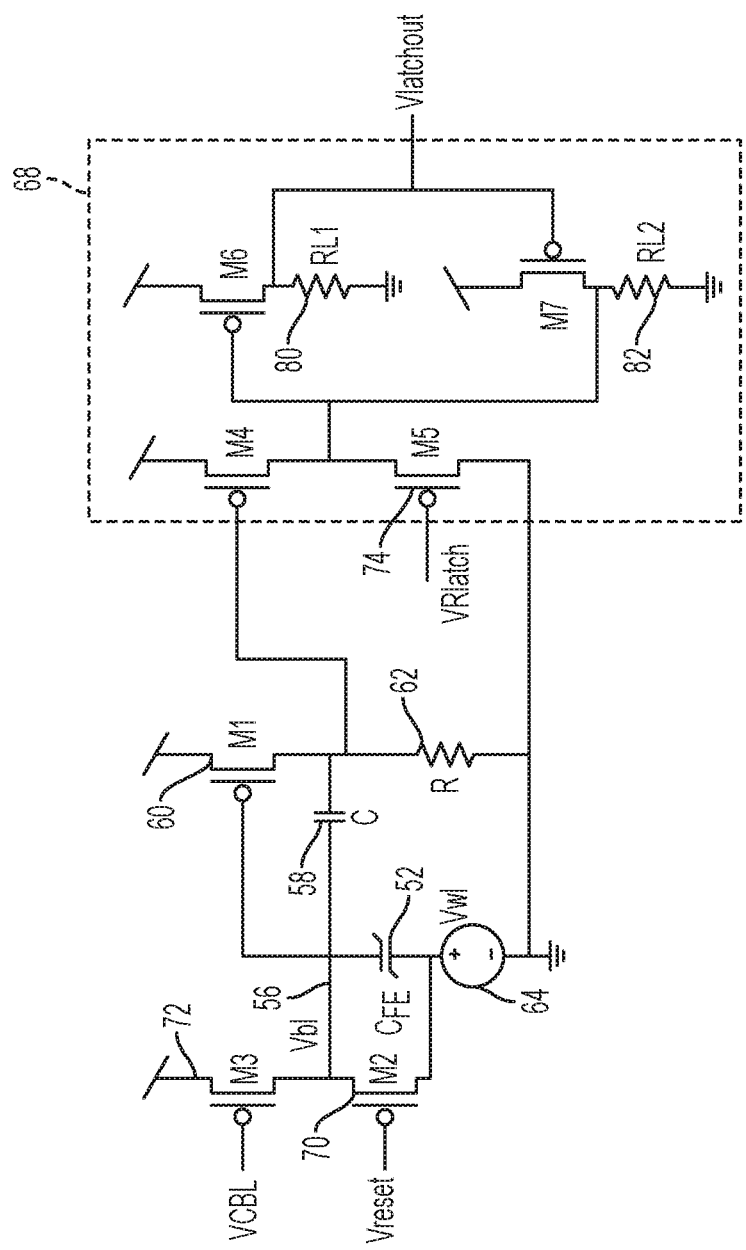
FIG. 8 shows an embodiment of a memory circuit implemented in only one polarity.

FIG. 7 shows another embodiment of the memory circuit. In this embodiment, the transistor in the gain stage M1 is a p-type transistor. The circuit is a mix of n-type and p-type transistors. For ease of manufacturing, especially with large-scale solution printing technologies, there are some advantages to implementing the entire circuit in a single polarity. This reduces the number of processing steps. This can lower the cost. Also, in some technologies, only a single polarity is available, making a single-polarity implementation necessary. FIG. 8 shows a single polarity implementation. In FIG. 8, the latch 68 has a slightly different architecture. It consists of transistors M4-M7 and latch resistors RL1 80 and RL2 82. The architectural changes allow the single polarity implementation. Other means of implementing inverter-based latches in a single-polarity implementation are also possible, including using inverters with diodeconnected or shorted gate-source transistor loads, among other options.

Figure 9:
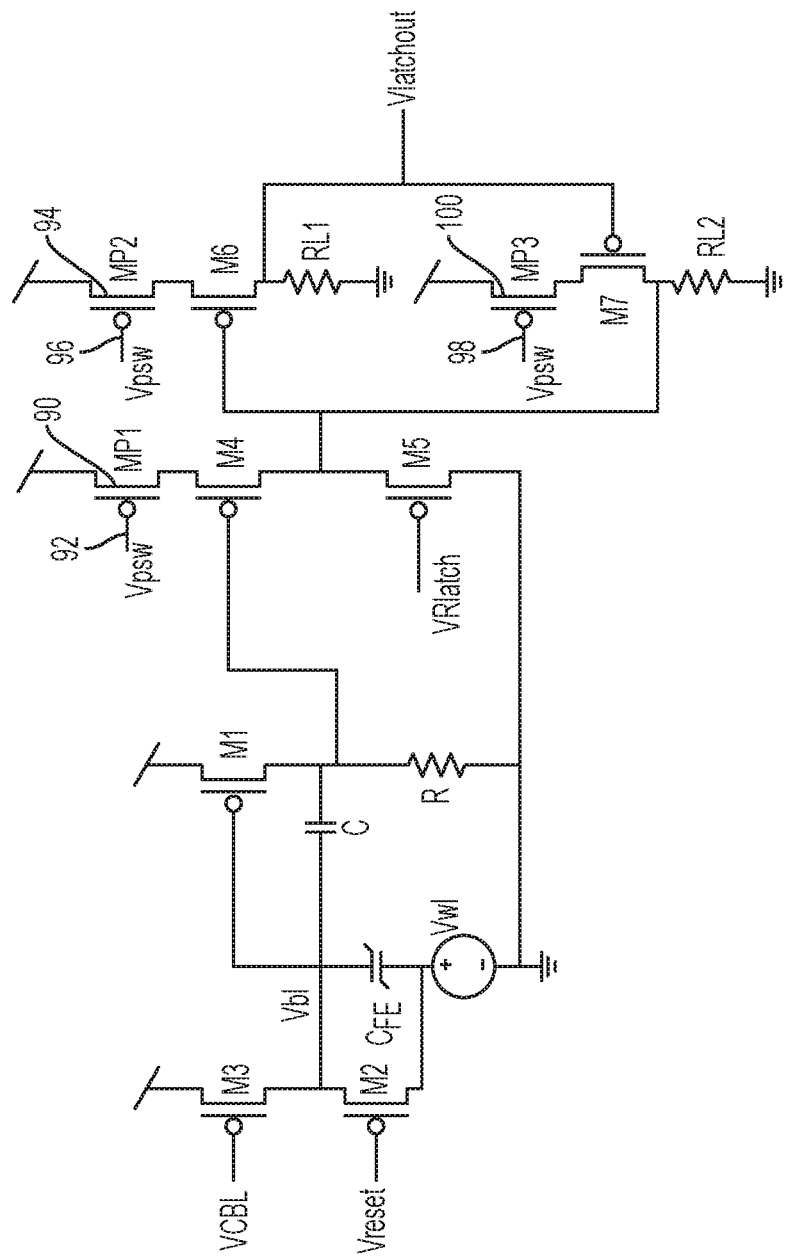
FIG. 9 shows an embodiment of a memory circuit with power switches.

FIG. 9 shows an embodiment that includes power switches MP1 90, MP2 94, and MP3 100. These switches can be turned off when the circuit is not in operation. Their state is controlled by the gate signal Vpsw 92 on MP1, 96 on MP2 and 98 on MP3. By turning the switches on and off, it can save static power consumption. More importantly, it can reduce the effect of bias stress. Bias stress is characterized by a change in a thin film transistor's (TFT) channel current under gate bias. It is a characteristic of many thin-film transistor technologies and can lead to temporal variation in circuit operation and ultimately to circuit failure. By turning off the circuit when not in use, the effects of bias stress on circuit operation can be minimized. In an alternative embodiment, the three power switches can be replaced by a single wider transistor.

Figure 10:
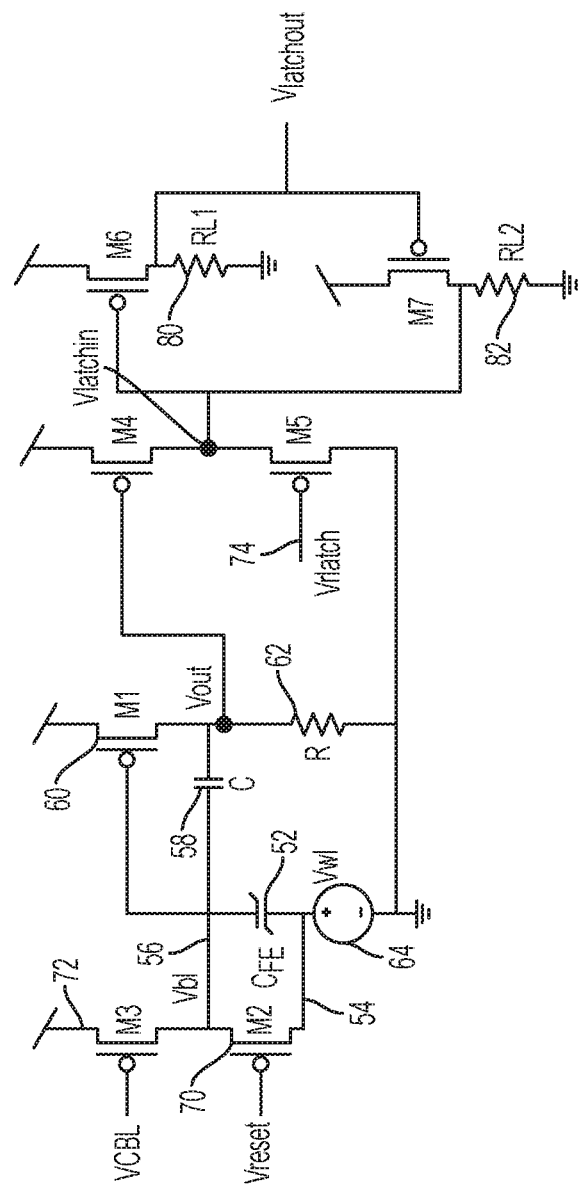
FIG. 10 shows an embodiment of a memory circuit having specific component widths.

FIG. 10 shows an embodiment of a circuit such as that shown in FIG. 8 but with the components selected to have particular values. In this embodiment, each component has the following value or width. The resistor R 62 has a value of 60 MOhms, the capacitor C 58 has a value of 50 picoFarads, and the latch resistors RL1 and RL2 have values of 100 MOhms. The transistors have specific widths. M1 is of 2 millimeters, M2 and M3 are both of 1 millimeter. M4 is 500 micrometers, M5 is of 10 millimeters, and M6 and M7 are both of 1 millimeter. The signal Vout feeds the gate of transistor M4 into the latch. The latch M4-M7 produces the latch output Vlatchout.

Figure 11A:
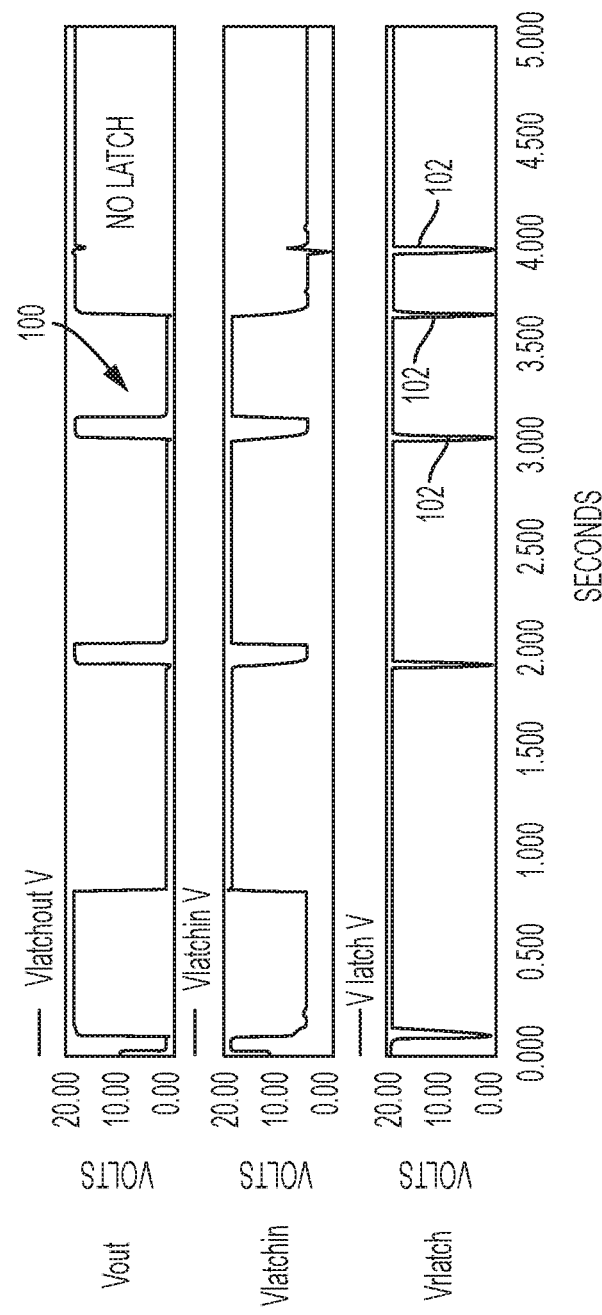
FIGS. 11A-B shows a graph of signals for operation of a memory circuit.
Figure 11B:
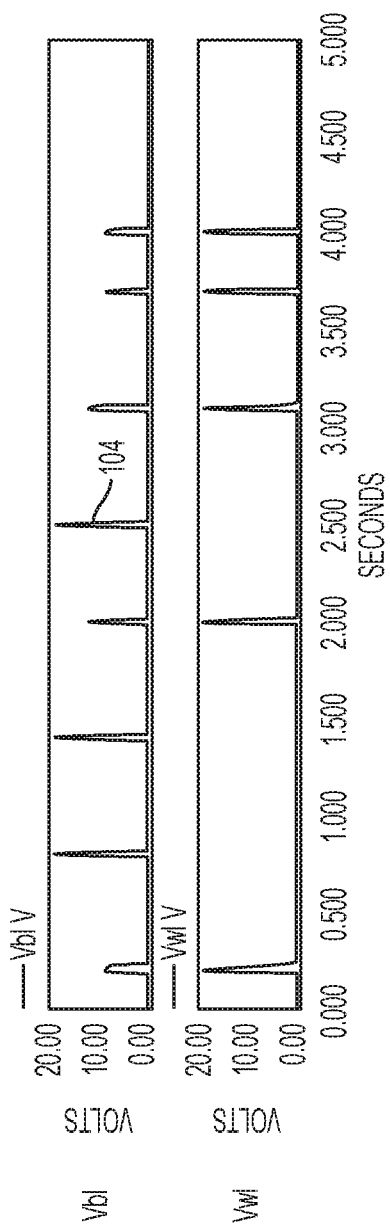

FIGS. 11A-B show an output of a simulation of the circuit in FIG. 10. In the signal Vout, the output is latched at 100, with Vlatchin shown in FIG. 10. Pulse 102 is where there is no latch (NO LATCH). In the signal Vrlatch the pulses 102 are reset pulses. In the Vbl trace, the high pulses such as 104 are where the transistor M3 is being used to write the cell by pulling the bit line to a high value relative to the wordline (Vwl), which is at ground.

Figure 12A:
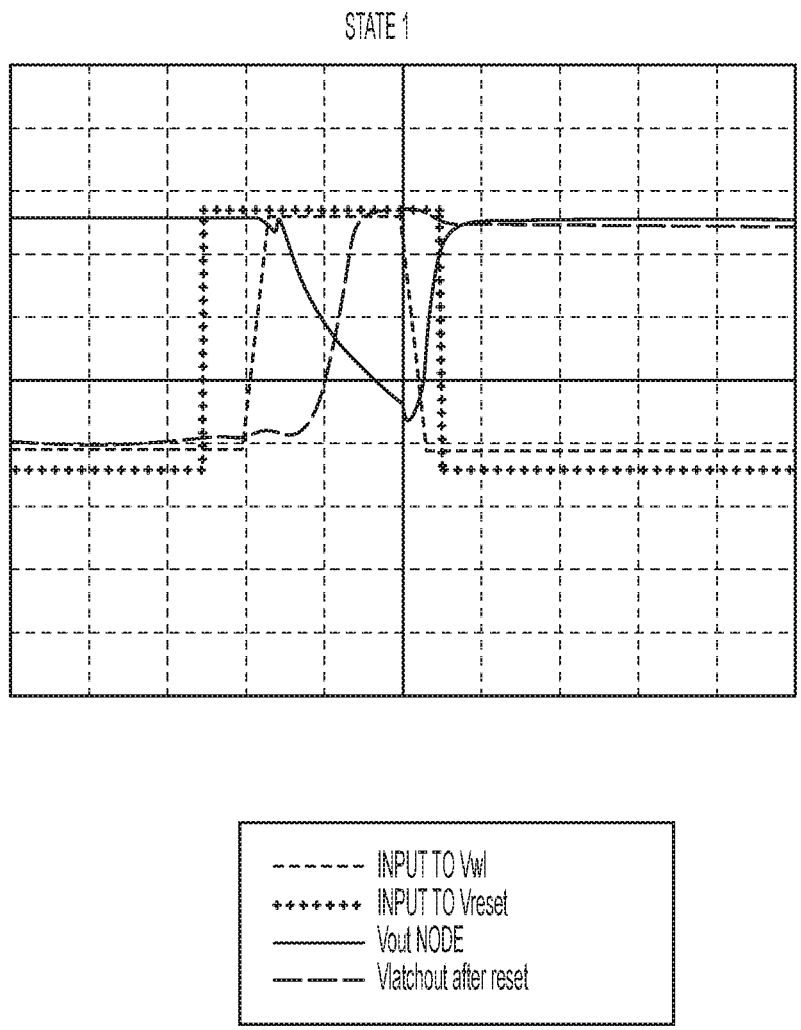
FIGS. 12A-B shows graphs of the memory states when the circuit is operating.
Figure 12B:
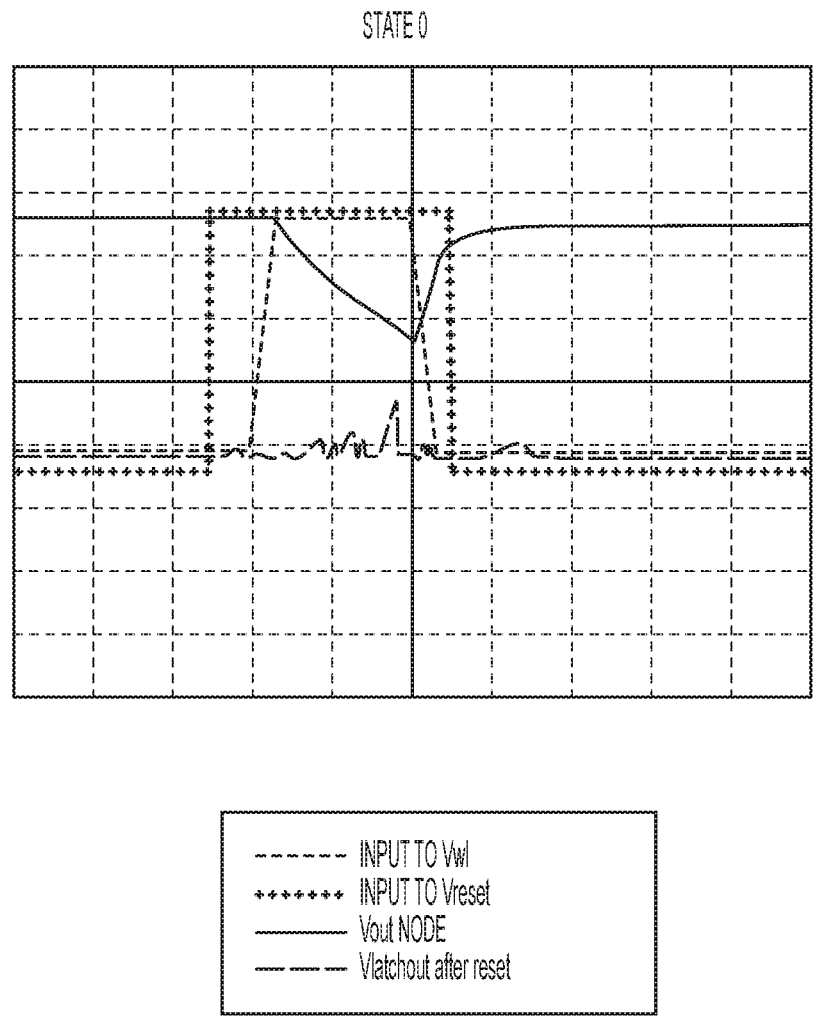

FIGS. 12A-B show measured the output signals from an implementation of the circuit using printed organic TFTs. In the figure, the solid trace is the signal Vout from FIG. 10, the dotted line is Vwl, the line of '+' signs is Vreset and the dashed line is the Vlatchout when it is the output of the latch. The horizontal lines in the graphs are separated at 5 volts per division. The graph on the left the '1' state is being read, and on the right the '0' state is being read. As can be seen the Vout trace in the 1 state is much steeper and goes farther down that the 0 state. The difference between these outputs sets the latch (Vout) to the high value when reading the 1 state, and keeps it at the low value when reading the 0 state. In this way, the system can detect the different states.

In this manner, a ferroelectric memory cell can have a readout circuit that is simpler than prior art embodiments. The simpler circuits are more easily implemented in large-scale, solution processed technologies, which have applications for low-cost and disposable electronics systems.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A memory circuit, comprising:
   an output terminal; and
   a memory circuit core electrically connected to the output terminal, comprising:
   a ferroelectric memory cell between a word line and a bit line;
   a voltage generator connected between the word line and a ground; and
   a gain element electrically connected to the bit line, wherein the gain element has a feedback capacitor connected between the bit line and the output terminal, and a single transistor connected between the bit line and the output terminal, wherein an output of the memory cell is read at the output terminal.

2. The memory circuit of claim 1, further comprising a latch electrically connected to the output terminal.

3. The memory circuit of claim 2, wherein the latch comprises a pair of cross-coupled transistors.

4. The memory circuit of claim 1, further comprising a reset transistor connected to the bit line of the memory cell.

5. The memory circuit of claim 1, wherein the feedback capacitor value is selected to cause a bias across the memory cell during a read operation sufficient to write the memory cell.

6. The memory circuit of claim 1, wherein the memory circuit is implemented in a single transistor polarity.

7. The memory circuit of claim 1, further comprising at least one power switch connected to the memory circuit to turn off the memory circuit.

8. The memory circuit of claim 1, wherein the at least one power switch comprises three power switches.

9. The memory circuit of claim 1, wherein the input transistor comprises a thin film transistor.

10. The memory circuit of claim 9, wherein the thin film transistor comprises a solution-processed thin film transistor.

11. The memory circuit of claim 1, wherein the memory circuit comprises an integrated, thin film transistor memory circuit.

12. A method of reading a memory cell, comprising:
    applying a voltage to a word line of the memory cell, causing charge to transfer from the memory cell to a feedback capacitor in a gain element, generating a voltage;
    amplifying the voltage by applying a gain having a magnitude of less than three using the gain element having the feedback capacitor and a single transistor;
    sensing an output voltage at an output terminal to read a state of the memory cell; and
    storing the memory state in a latch.

13. The method of claim 12, wherein applying the voltage to the word line causes the memory cell to be written to a memory state.

14. A memory circuit, comprising:
    an output terminal; and
    a memory circuit core, comprising:
    a ferroelectric memory cell between a word line and a bit line;
    an input transistor connected to the bit line; and
    a gain element electrically connected the bit line, wherein the gain element has a feedback capacitor connected between the bit line and the output terminal, and a has a gain of three or less, wherein an output of the memory cell is read at the output terminal.

15. The memory circuit of claim 14, further comprising a latch electrically connected to the output terminal.

16. The memory circuit of claim 15, wherein the latch comprises a pair of cross-coupled transistors.

17. The memory circuit of claim 14, further comprising a reset transistor connected to the bit line of the memory cell.

18. The memory circuit of claim 14, wherein the memory circuit is implemented in a single transistor polarity.

* * * * *